United States Patent
Pei (10) Patent No.: US 10,944,937 B2
(45) Date of Patent: Mar. 9, 2021

(54) TELEVISION PANEL MOUNT

(71) Applicant: Xubo Pei, Guangdong (CN)

(72) Inventor: Xubo Pei, Guangdong (CN)

( * ) Notice: Subject to any disclaimer, the term of this patent is extended or adjusted under 35 U.S.C. 154(b) by 4 days.

(21) Appl. No.: 16/190,116

(22) Filed: Nov. 13, 2018

(65) Prior Publication Data
US 2020/0120305 A1 Apr. 16, 2020

(30) Foreign Application Priority Data
Oct. 16, 2018 (CN) .......................... 201811203458.1

(51) Int. Cl.
| | |
|---|---|
| A47B 97/00 | (2006.01) |
| H04N 5/655 | (2006.01) |
| F16M 13/02 | (2006.01) |
| H05K 5/00 | (2006.01) |
| H05K 5/02 | (2006.01) |

(52) U.S. Cl.
CPC .......... *H04N 5/655* (2013.01); *A47B 97/001* (2013.01); *F16M 13/02* (2013.01); *F16M 2200/027* (2013.01); *F16M 2200/06* (2013.01); *H05K 5/0017* (2013.01); *H05K 5/0204* (2013.01)

(58) Field of Classification Search
CPC .................. H04N 5/655; A47B 97/001; F16M 2200/027; F16M 2200/06; F16M 11/045; F16M 11/08; F16M 11/2085; F16M 11/06; F16M 13/02; H05K 5/0204; H05K 5/0017
See application file for complete search history.

(56) References Cited

U.S. PATENT DOCUMENTS

| | | | | |
|---|---|---|---|---|
| 1,156,885 | A * | 10/1915 | Caine .................. | G09F 7/18 248/218.4 |
| 4,830,531 | A * | 5/1989 | Condit .................. | F16B 37/045 403/348 |
| 6,079,677 | A * | 6/2000 | Daoud .................. | H02G 3/16 248/201 |
| 7,195,213 | B2 * | 3/2007 | Weatherly ............ | A47B 81/061 248/124.1 |
| 7,438,269 | B2 | 10/2008 | Pfister et al. | |
| 7,487,943 | B1 * | 2/2009 | Gillespie ................ | F16M 11/10 248/279.1 |
| 7,661,640 | B2 * | 2/2010 | Persson .................. | F16M 13/02 248/225.11 |
| 8,596,599 | B1 * | 12/2013 | Carson ................. | F16M 11/041 248/429 |
| 8,827,226 | B2 * | 9/2014 | Townsend .......... | F16M 11/2014 248/323 |

(Continued)

FOREIGN PATENT DOCUMENTS

CN 204829191 U 12/2015

*Primary Examiner* — Christopher Garft
(74) *Attorney, Agent, or Firm* — Fish IP Law, LLP (57) ABSTRACT

A TV panel mount, characterized by including: a wall chassis; a mounting base slidably connected to the wall chassis; a mounting bracket assembled with the mounting base for mounting a TV panel, where the wall chassis is provided with parallel slide rails, and the mounting base includes a slidable frame having an inner side to be attached to an outer side of each of the slide rails; and an adjustment member mounted in the slidable frame to adjust the friction between the slidable frame and the slide rail so that the slidable frame can slide or be fixed along an extension direction of the slide rail.

16 Claims, 11 Drawing Sheets

(56) References Cited

U.S. PATENT DOCUMENTS

| | | | |
|---|---|---|---|
| 2006/0238967 A1* | 10/2006 | Carson | F16M 11/14 |
| | | | 361/679.04 |
| 2008/0006751 A1* | 1/2008 | Chen | F16M 11/10 |
| | | | 248/278.1 |
| 2008/0151483 A1 | 6/2008 | Holbrook et al. | |
| 2009/0173860 A1* | 7/2009 | Remy | F16M 11/10 |
| | | | 248/278.1 |
| 2009/0194655 A1* | 8/2009 | Huang | F16M 11/10 |
| | | | 248/282.1 |
| 2010/0172072 A1* | 7/2010 | Monaco | F16M 11/38 |
| | | | 361/679.01 |
| 2011/0019344 A1* | 1/2011 | Russell | F16M 11/2092 |
| | | | 361/679.01 |
| 2011/0174944 A1* | 7/2011 | Fredette | F16M 13/02 |
| | | | 248/220.22 |
| 2011/0233346 A1* | 9/2011 | Schluter | F16M 11/041 |
| | | | 248/65 |
| 2012/0056050 A1* | 3/2012 | Huang | F16M 11/2064 |
| | | | 248/124.1 |
| 2013/0187019 A1* | 7/2013 | Dittmer | F16M 11/2092 |
| | | | 248/277.1 |
| 2015/0250315 A1* | 9/2015 | Gross | H05K 5/0017 |
| | | | 361/679.01 |
| 2016/0058184 A1 | 3/2016 | Whalen et al. | |
| 2019/0050026 A1* | 2/2019 | Carson | G06F 1/1624 |

* cited by examiner

TELEVISION PANEL MOUNT

CROSS-REFERENCE TO RELATED APPLICATIONS

The present application claims the benefits of Chinese Patent Application No. 201811203458.1, filed on Oct. 16, 2018, the content of which is incorporated herein by reference in its entirety.

TECHNICAL FIELD

The present invention relates to the technical field of mounts, and in particular, to a TV panel mount.

BACKGROUND ART

The TV panel mount is a TV panel peripheral designed for hanging flat TV panels or liquid-crystal display TV panels on walls. The TV panel mount is suitable for use in living rooms, offices, conference halls, and other places.

At present, a common TV panel mount is usually fixedly connected to a TV panel. The TV panel mount is usually mounted on the wall. In some interior designs in some area of the United States, multiple wooden columns are usually designed indoors. The TV panel is usually mounted on the wooden columns.

However, the horizontal location of the mounted TV panel is usually unsuitable, and consequently, the front-facing location of a sofa or a chair placed in the room is often asymmetrical with the location where the TV panel is mounted, which easily affects experience of people when watching TV panel programs. In real life, the location of the sofa or the chair is usually relatively fixed, and it is not easy to move them. It is also troublesome to detach the TV panel mount and mount it again.

SUMMARY OF THE INVENTION

With respect to the deficiencies of the prior art, an object of the present invention is to provide a TV panel mount comprising: a wall chassis;

a mounting base slidably connected to the wall chassis; and a mounting bracket assembled with the mounting base for mounting a TV panel, where the wall chassis is provided with parallel slide rails, and the mounting base includes a slidable frame having an inner side to be attached to an outer side of each of the slide rails; and an adjustment member mounted in the slidable frame to adjust the friction between the slidable frame and the slide rail so that the slidable frame can slide or be fixed along an extension direction of the slide rail.

Numerical identifiers: 1: wall chassis; 11: slide rail; 111: reinforcing bar; 12: slot; 121: stop; 13: channel; 14: slidable bar; 2: mounting base; 21: slidable frame; 22: mounting plate; 23: reinforcing rib; 3: screw; 31: threaded hole; 4: security screw; 41: lock nut; 5: primary supporting arm; 51: main boom screw; 52: secondary supporting arm; 53: jib arm screw; 54: copper gasket; 55: nylon nut; 6: connection plate; 60: pan head hexalobular screw; 61: small rectangle plate; 62: lever; 621: thread section; 622: handle; 64: large rectangle plate; 65: retainer gasket; 66: steel gasket; 7: vertical plate; 71: pipe clip; 72: locking screw; 81: egg-sectional tube; 82: secondary frame; 83: round head cross screw; 9: arcuate-slot ledge; 91: arcuate slot.

DETAILED DESCRIPTION OF THE INVENTION

The following further describes the present invention in detail with reference to the accompanying drawings.

Figure 1:
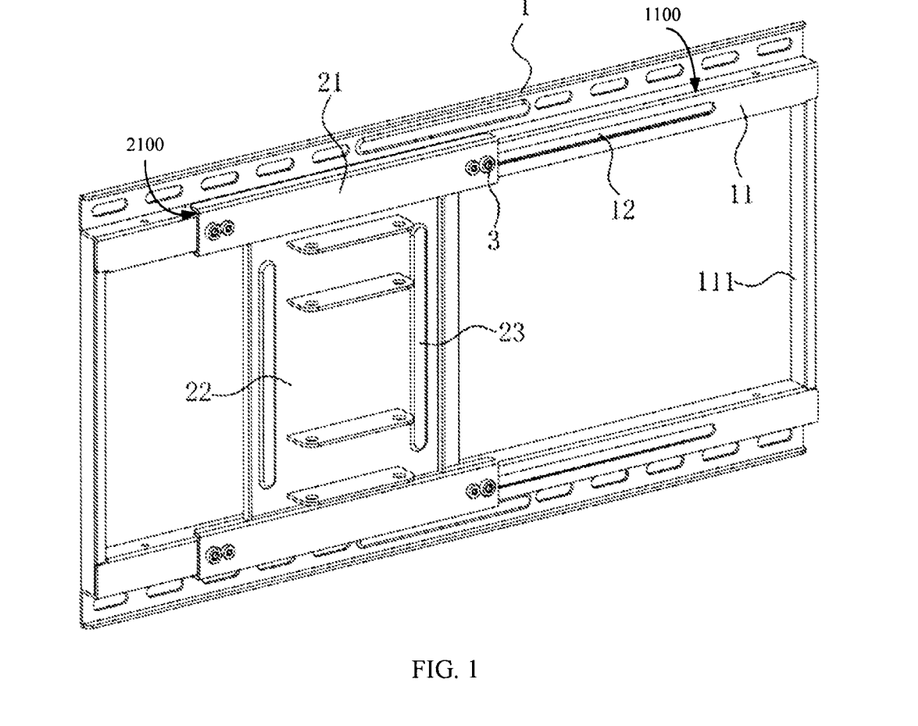
FIG. 1 is a schematic view of an assembly structure of a wall chassis and a mounting base in an embodiment of the present invention.
Figure 2:
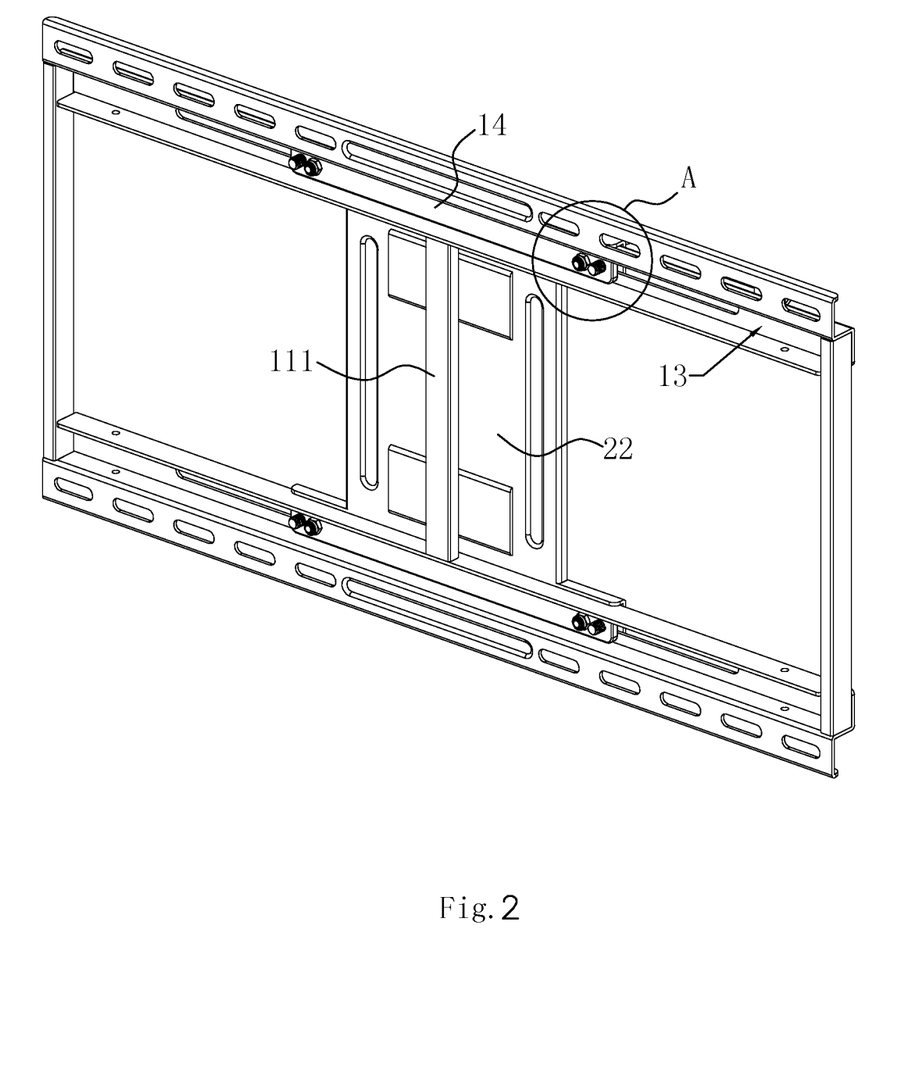
FIG. 2 is a schematic view of assembly of a security screw and an lock nut in an embodiment of the present invention.

This embodiment: a TV panel mount, as shown in FIG. 1 and FIG. 2, includes a wall chassis 1; a mounting base 2 slidably connected to the wall chassis 1; and a mounting bracket assembled with the mounting base 2, where the mounting bracket is used to carry the TV panel, so that the TV panel can be hung on the mounting bracket, and the wall chassis 1 can be adapted to various mounting brackets, and this can improve the applicability of the TV panel mount.

A pair of parallel slide rails 11 are disposed on the wall chassis 1. There may be a plurality of slide rails 11. The mounting base 2 includes: a slidable frame 21 having a U-shaped section. The inner side of the slidable frame 21 is attached to the outer side of the slide rail 11, so that the slidable frame 21 particially surround the slide rail 11 in section. A slot 12 is disposed in the slide rail 11, and the extension of the slot 12 is parallel to the extension of the slide rail 11. In addition, an adjustment member is mounted on the slidable frame 21, and the adjustment member passes through the slot 12 and slide along the extension of the slot 12, and the adjustment member can clamp or loosen the slidable frame 21 and the slide rail 11.

In this embodiment, the adjustment member includes a screw 3 inserted through the end portion of the slidable frame 21 and the slot 12. An channel 13 is disposed along the slide rail 11, and a slidable bar 14 is moveably accommodated in the channel 13. The slidable bar 14 can slide in the channel 13. In this embodiment, a threaded hole 31 for engaging the screw 3 is disposed in the slidable bar 14, and the end portion of the screw 3 passes through the slidable bar 14. When the screw 3 loosens the slidable frame 21, the slidable bar 14 can move together. By screwing up the screw 3, the slidable frame 21 is fixed to the slide rail 11.

In this embodiment, a compression spring is sleeved around the screw 3 and pressed on the outer side of the slidable frame 21, and by rotating the screw 3, the abutting force of the compression spring on the slide rail 11 can be adjusted, thereby adjusting the tightness between the slidable frame 21 and the slide rail 11.

In this embodiment, when the position of the TV panel or the mounting bracket needs to be adjusted, the screw 3 is rotated first, and to release the screw 3 from the slidable frame 21, so that the inner side of the slidable frame 21 is released from the outer side of the slide rail 11. Therefore, the slidable frame 21 can conveniently slide, so that the mounting base 2 drives the mounting bracket to slide together. After the position of the mounting base 2 is adjusted, the mounting base 2 can be fixed by tightening the screw 3. Through this solution, the adjustment of the horizontal position of the TV panel can be easily implemented, so that the user can watch the TV panel or program comfortably as desired.

Figure 3:
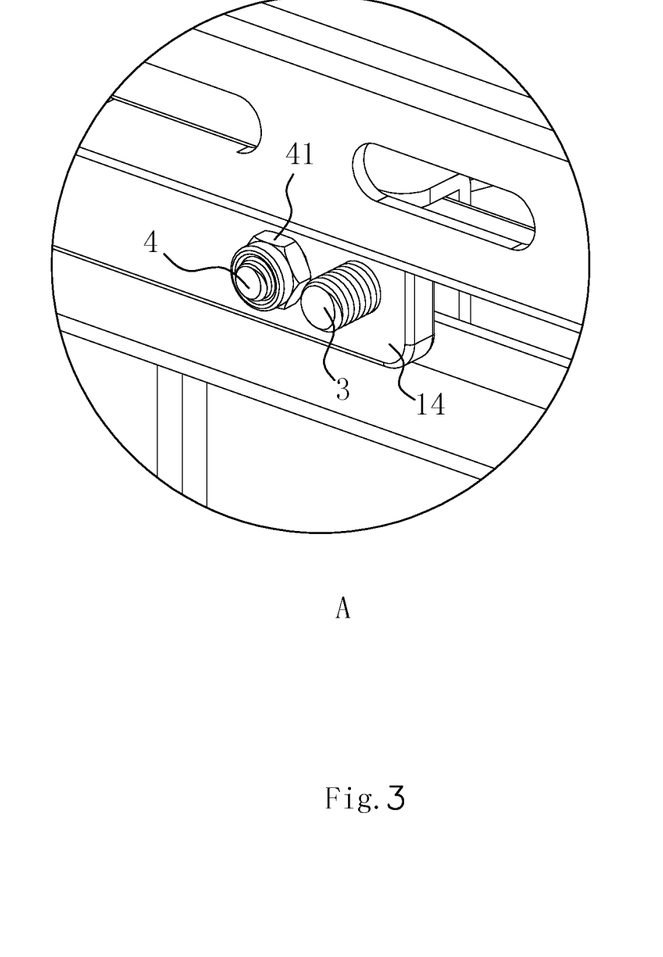
FIG. 3 is an enlarged view of A in FIG. 2 in an embodiment of the present invention.

In addition, a security screw 4 passes through the slot 12 and the slidable bar 14 and the slidable frame 21, and the end portion of the security screw 4 is connected to a limiting member in a threaded manner. In this embodiment, the limiting member is an lock nut 41 (as shown in FIG. 3), and the security screw 4 and the lock nut 41 cooperate with each other, so that the security screw 4 can move within the slot 12 with the movement of slidable frame 21, and can play a certain guiding role for the slidable frame 21. When the screw 3 is loose, the disposed security screw 4 and lock nut 41 can prevent the slidable frame 21 from being detached from the slide rail 11 and causing the TV panel to fall and be damaged.

In this embodiment, several reinforcing bars 111 are formed with the wall chassis 1, and the number of the reinforcing bars 111 is preferably three. One is provided on either end of the wall chassis 1, and one is mounted in the middle of the wall chassis 1, so as to strengthen the wall chassis 1.

Further, the outside corners of the slide rail 11 are rounded to clear off the inside edges of the slidable frame 21 for a reduced frictional force between the slide rails and the slidable frames 21.

Figure 4:
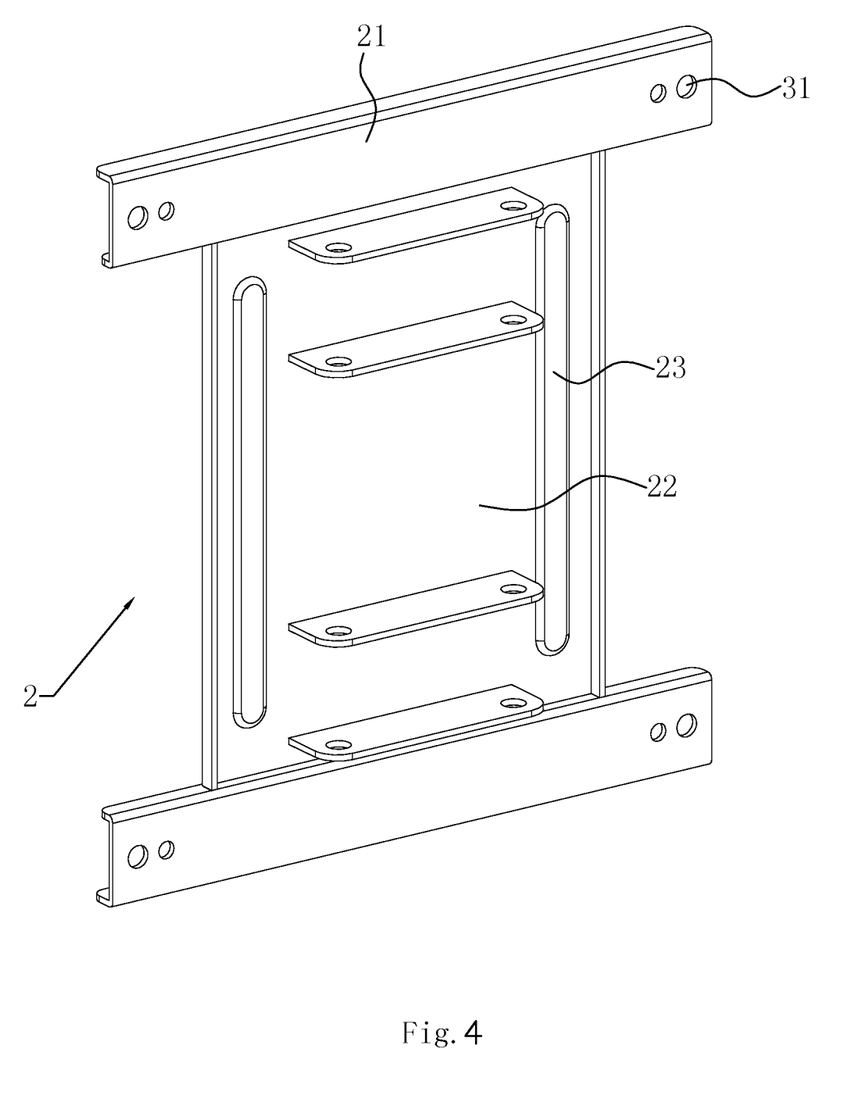
FIG. 4 is a schematic structural view of a mounting base in an embodiment of the present invention.

As shown in FIG. 4, the mounting base 2 in this embodiment further includes a mounting plate 22 connected between the parallel slidable frames 21, and the mounting plate 22 further strengthens the slidable frame 21, and at the same time, a reinforcing rib 23 is disposed on either side of the mounting plate 22, and the reinforcing rib 23 is extended along the extension direction of the slidable frame 21. The reinforcing rib 23 can enhance the strength of the mounting plate 22 and improve the overall stability of the mounting base 2.

Figure 5:
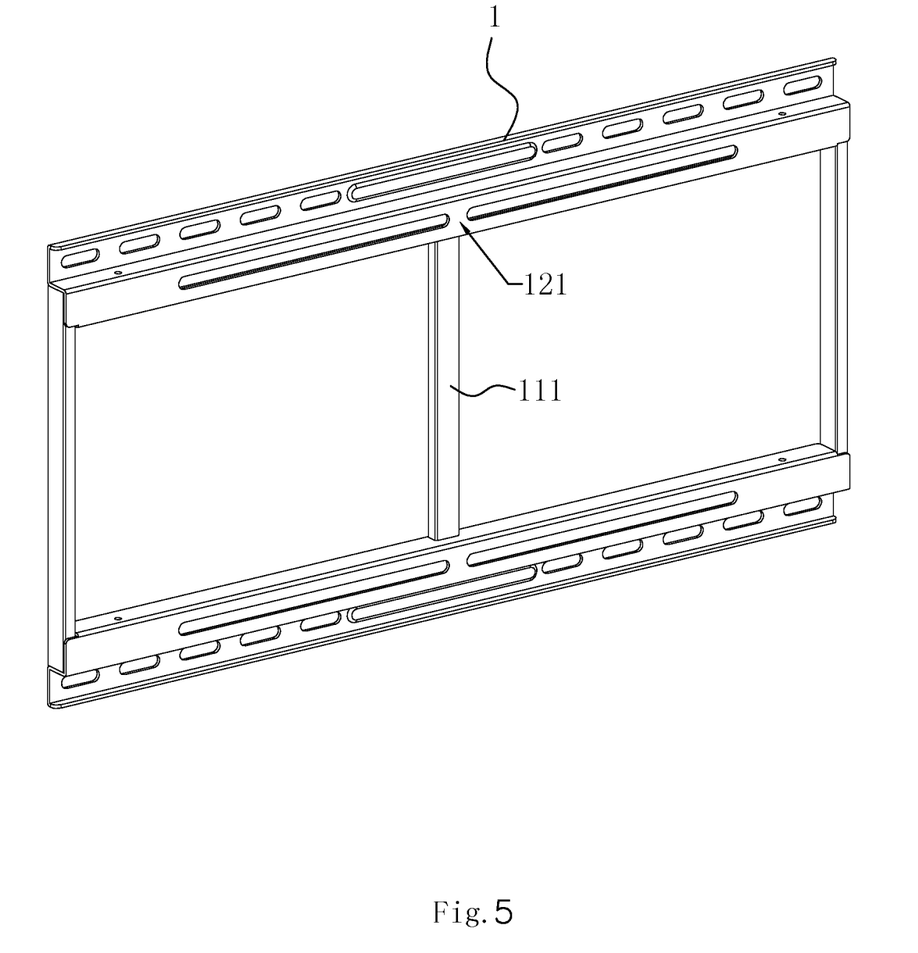
FIG. 5 is a schematic view of a stopstop in an embodiment of the present invention.

As shown in FIG. 5, a stop 121 is disposed in the slot 12 of the slide rail 11, and the stop 121 is integrally formed with the wall chassis 1, and the stop 121 can limit the security screw 4 and the screw 3 in position. This can prevent the slidable frame 21 from moving too far and causing the TV panel to collide with the surrounding wall or object. In this embodiment, the stop 121 is located at a middle position of the slot 12, and the stop 121 is integrally formed with the wall chassis 1, and the slot 12 consists of a pair of shorter slots. This enhances the strength of the wall chassis 1.

Figure 6:
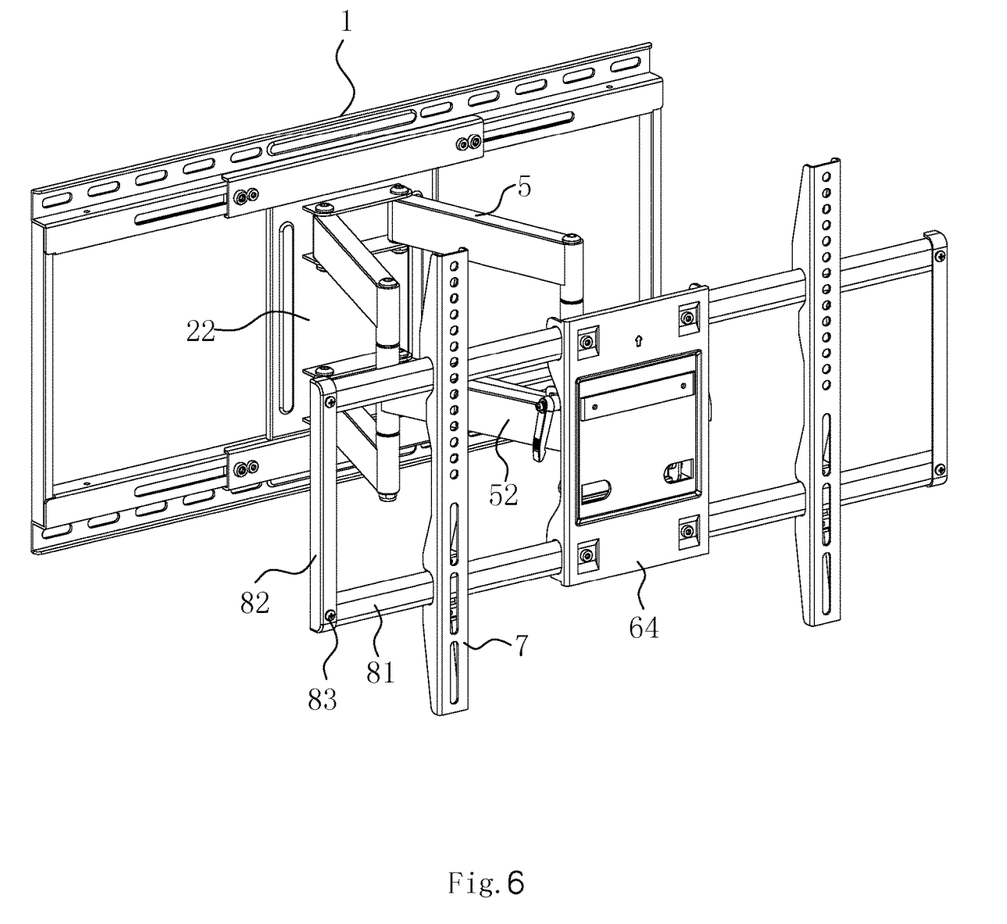
FIG. 6 is a schematic view of assembly of a wall chassis, a mounting base, and a mounting bracket in an embodiment of the present invention.
Figure 7:
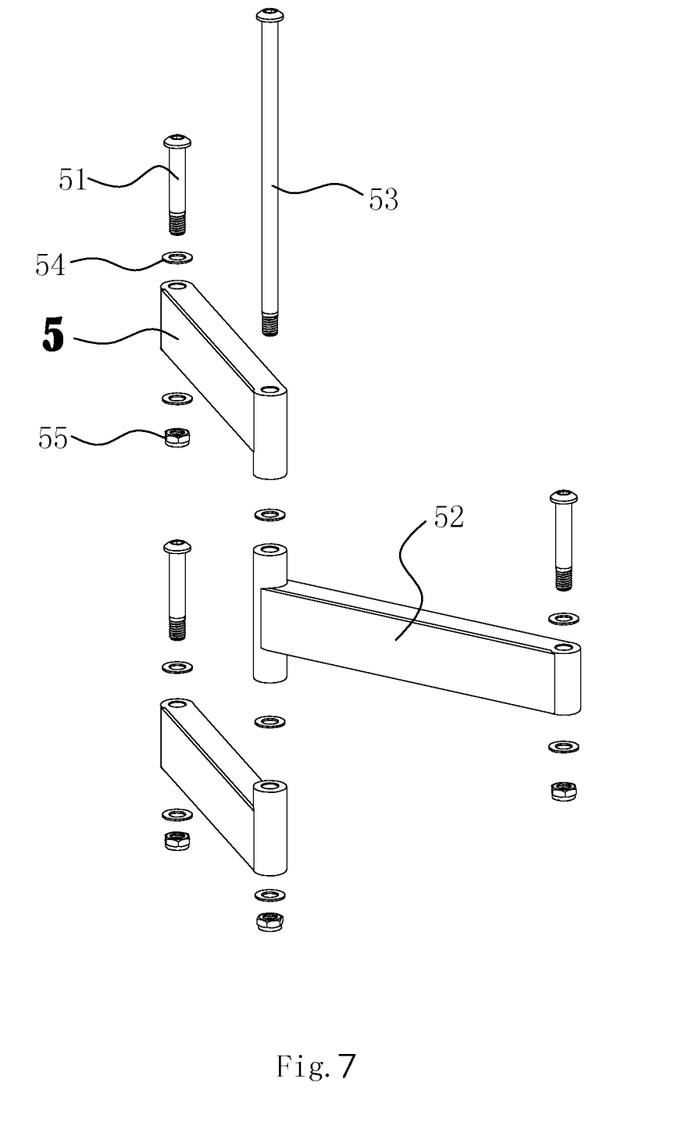
FIG. 7 is a schematic exploded view of a hinge seat in an embodiment of the present invention.

As shown in FIG. 6 and FIG. 7, the mounting bracket includes a hinge seat and a TV panel holder. In this embodiment, the mounting bracket includes two sets of symmetrical primary supporting arms 5 hinged to the mounting plate 22, wherein each set of primary supporting arms 5 includes a pair of primary supporting arms 5 parallel in a vertical plane; and a secondary supporting arm 52 hinged on an end of the primary supporting arm 5 away from the mounting plate 22, and the TV panel holder is hinged on an end of the secondary supporting arm 52 away from the primary supporting arm 5.

FIG. 7 is a structural schematic view of the hinge seat. A plurality of parallel lug plates are fixed on the mounting plate 22, and a main boom screw 51 is inserted through a copper gasket 54 between the lug plate and the end portion of the primary supporting arm 5, and, the copper gasket 54 is in contact with the end of the primary supporting arm 5, and the copper gasket 54 reduces the friction between the primary supporting arm 5 and the lug plat.

A nylon nut 55 is threadedly connected to an end of the main boom screw 51 away from the copper gasket 54. A jib arm screw 53 is inserted between the end of the parallel primary supporting arms 5 away from the main boom screw 51, and the secondary supporting arm 52. The jib arm screw 53 sequentially passes through the upper primary supporting arm 5, the secondary supporting arm 52, and the lower primary supporting arm 5. In this way, the upper and lower primary supporting arms 5 are yoked with one secondary supporting arm 52. By using this structure, by rotating the primary supporting arm 5 or the secondary supporting arm 52, it is convenient to adjust the position of the TV panel holder. In this embodiment, the primary supporting arms 5 and the secondary supporting arms 52 can be rotated close to the mounting plate 22, for a compact package and transportation.

Figure 8:
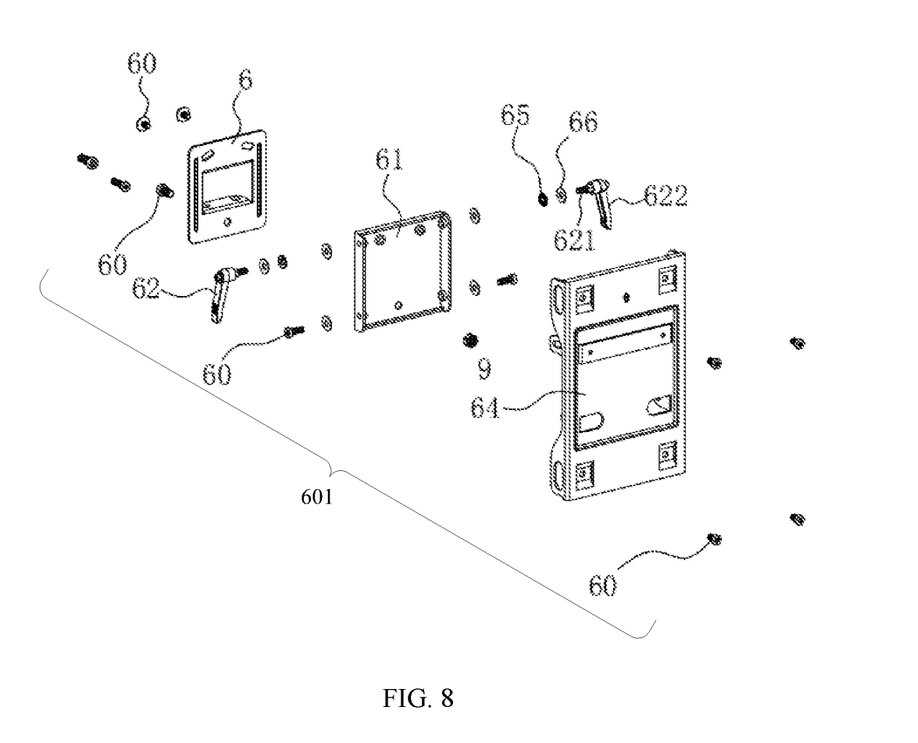
FIG. 8 is a schematic exploded view of a connection assembly in an embodiment of the present invention.

As shown in FIG. 6 and FIG. 8, the TV panel holder includes a connection assembly 601, an egg-sectional tube 81 mounted to the connection assembly 601, and a vertical plate 7 assembled with the TV panel, where the connection assembly 601 includes a connection plate 6 hinged with an distal end portion of the secondary supporting arm 52; a small rectangle plate 61 assembled with the connection plate 6 by using a plurality of pan head hexalobular screws 60; and a large rectangle plate 64 detachably mounted on the small rectangle plate 61; on the large rectangle plate 64, the pan head hexalobular screws 60 are assembled with the egg-sectional tubes 81, and the egg-sectional tubes 81 are arranged in parallel; the egg-sectional tube 81 is perpendicular to the main boom screw 51, and parallel secondary frames 82 are mounted on the parallel egg-sectional tubes 81 by using a round head cross screw 83; the two secondary frames 82 and the two egg-sectional tubes 81 form a rectangular mounting frame; the mounting frame can better match the TV panel, thereby facilitating mounting of the TV panel.

In addition, vertical plates 7 are disposed on the two egg-sectional tubes 81 in parallel with each other, and are perpendicular to the egg-sectional tube 81, and a plurality of mounting holes is formed in the vertical plate 7, and the mounting holes are distributed on the vertical plate 7 along the extension direction of the vertical plate 7. The mounting holes can be used together with the bolt to facilitate mounting and dismounting of the TV panel.

Figure 9:
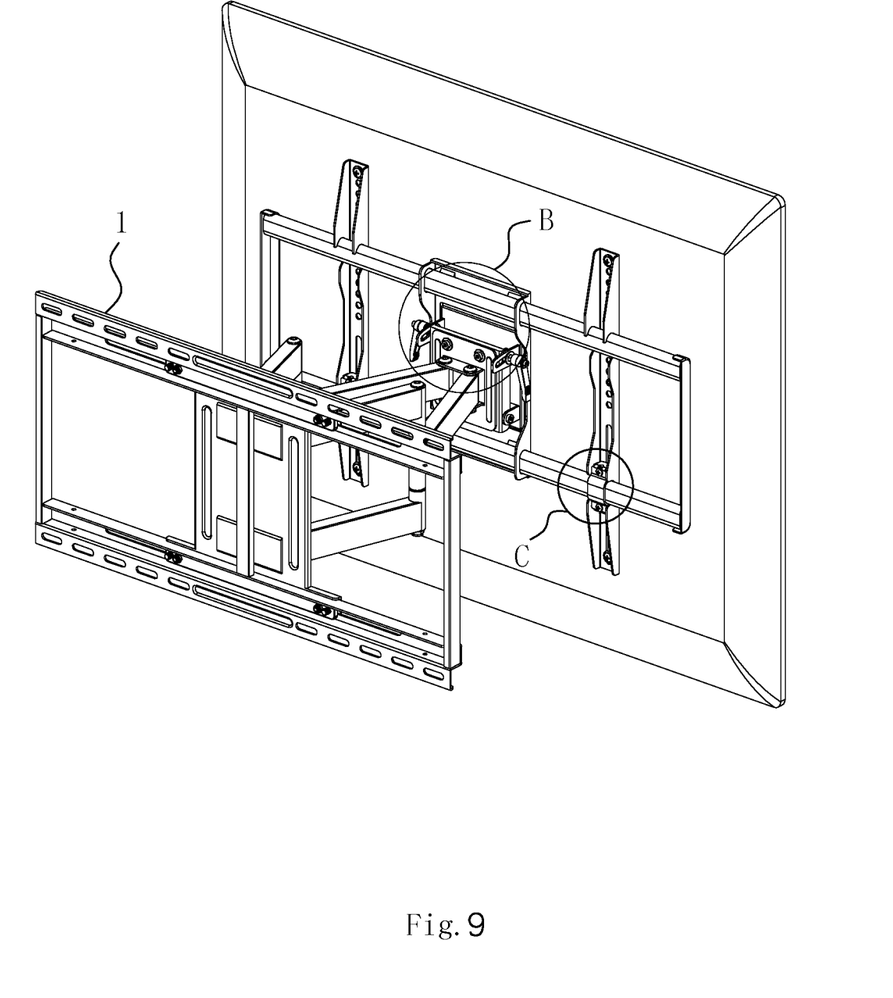
FIG. 9 is a schematic structural view of a TV panel holder in an embodiment of the present invention.
Figure 10:
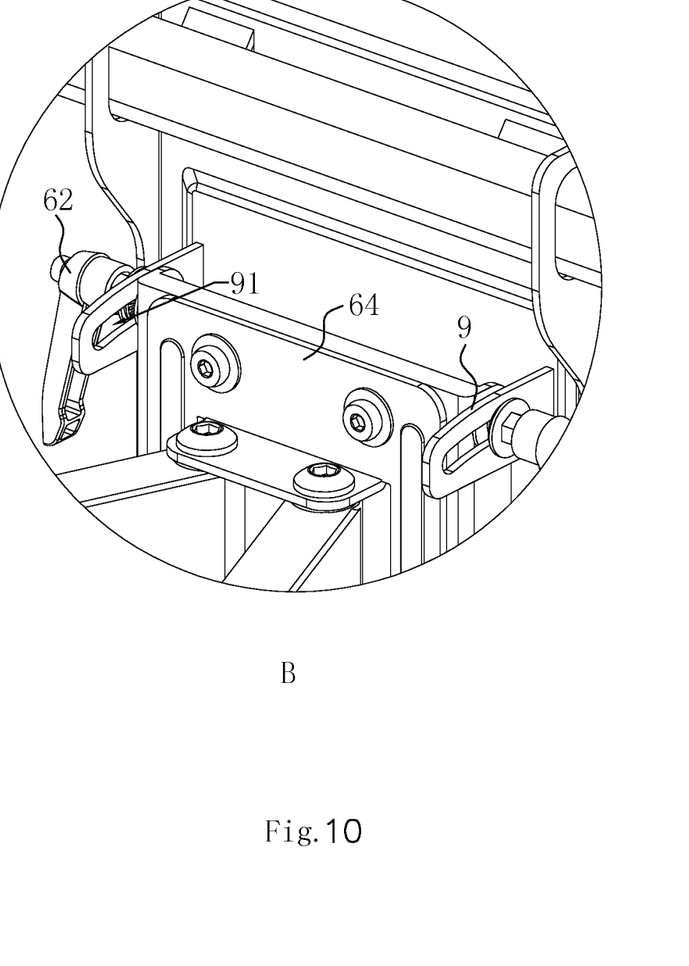
FIG. 10 is an enlarged view of B in FIG. 9 in an embodiment of the present invention.

As shown in FIG. 8 to FIG. 10, in this embodiment, a lever 62 is mounted on either side of the large rectangle plate 64, and the lever 62 includes two parts a thread section 621 and a handle 622, and an arcuate-slot ledge 9 is further mounted on either side of the large rectangle plate 64; an arcuate slot 91 is disposed in the arcuate-slot ledge 9, and the thread section 621 passes through the arcuate slot 91 and is threadedly assembled with the small rectangle plate 61. In addition, a retainer gasket 65 and an steel gasket 66 are sleeved on the thread section 621, and the steel gasket 66 is located between the retainer gasket 65 and the handle 622. The retainer gasket 65 can also reduce the friction between the lever 62 and the large rectangle plate 64.

When the angle of the large rectangle plate 64 needs to be adjusted, the handle 622 can be rotated, so that the thread section 621 drives the large rectangle plate 64 to slide within the arcuate slot 91, so that the angle of the large rectangle plate 64 can be adjusted. After the position of the large square plate large rectangle plate 64 is adjusted, the large rectangle plate 64 can be fixed by rotating the lever 62. In this embodiment, a range of angle adjustment of the large rectangle plate 64 is: 0-20°. Through this structure, it is convenient to adjust the mounting angle of the TV panel.

Figure 11:
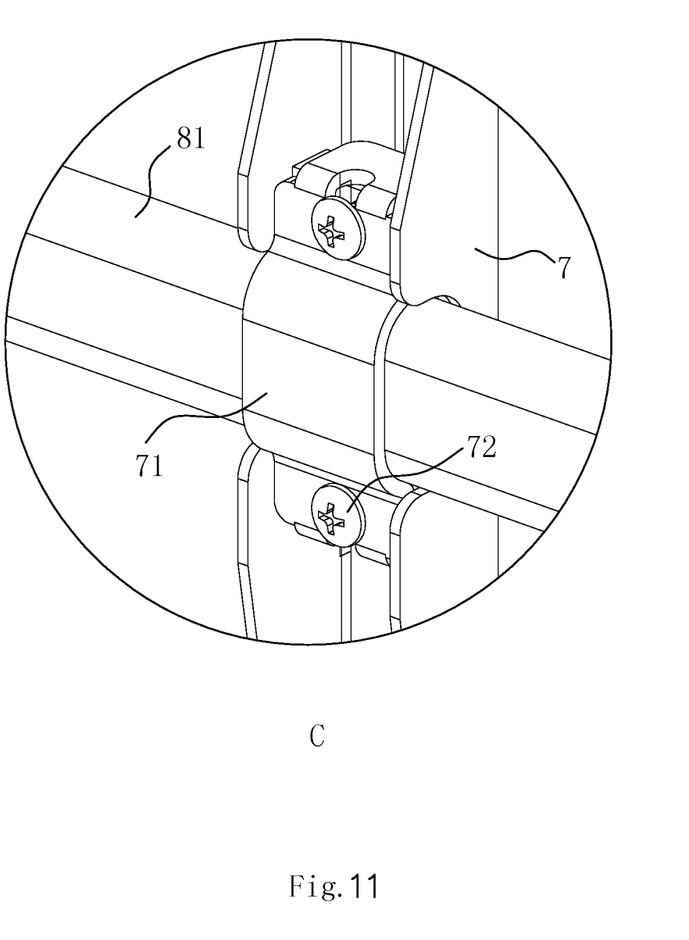
FIG. 11 is an enlarged view of C in FIG. 9 in an embodiment of the present invention.

As shown in FIG. 9 and FIG. 11, in this embodiment, each vertical plate 7 is provided with a hook for fitting the egg-sectional tube 81, and at the same time, the vertical plate 7 is also provided with a clamping channel for fitting the egg-sectional tube 81, and the vertical plate 7 is also provided with a pipe clip 71. When the TV panel needs to be mounted, the TV panel may be mounted on the vertical plate 7 first, and then the hook on the vertical plate 7 is fitted with the egg-sectional tube 81, and then the clamping channel on the vertical plate 7 is matched with the egg-sectional tube 81, and the pipe clip 71 is then fixed at the position of the clamping channel by using a locking screw 72, so that the inner side of the pipe clip 71 abuts against with an outer wall of the egg-sectional tube 81. Through this structure, a quick mounting and dismounting of the TV panel can be conveniently implemented.

Specific embodiments of the present invention merely explain the present invention, and are not intended to limit the present invention. Those skilled in the art can make modifications that do not make creative contributions to the embodiments based on needs after reading this specification. The modifications are protected by the Patent Law provided that they fall within the scope of the claims.

The invention claimed is:

1. A TV panel mount comprising:
    a wall chassis (1) provided with two parallel slide rails (11), that is an upper slide rail (11) and a lower slide rail (11) parallel to the upper slide rail;
    a mounting base (2) comprising two parallel slidable frames (21) to be attached to the upper slide rail (11) and the lower slide rail (11) respectively, and a mounting plate (22) coupled between the two parallel slidable frames (21);
    an adjustment member comprising at least two screws (3) each inserted through one of the two parallel slidable frames (21);
    a mounting bracket comprising two symmetrical primary supporting arms, a secondary supporting arm (52) and a TV panel holder, one end of each primary supporting arm (5) is hinged on the mounting plate (22), and another end of each primary supporting arm (5) is hinged to the secondary supporting arm (52), and a distal end of the secondary supporting arm (52) is assembled with the TV panel holder, and the TV panel holder is for mounting a TV panel; and
    wherein, by rotating the at least two screws (3), tightness between the two parallel slidable frames (21) and the two parallel slide rails (11) are adjusted, so that the two parallel slidable frames (21) are slidable or are fixed along an extension direction of the two parallel slide rails (11);
    wherein, a slot is defined on one side of each slide rail along the extension direction of the two parallel slide rails; a channel (13) is defined on an opposite side of each slide rail along the extension direction of the two parallel slide rails and interconnected with the corresponding slot; two slidable bars (14) each is moveably accommodated in one of the two channels; at least one threaded hole is defined on each of the two slidable bars (14); each of the at least two screws (3) sequentially passes through one of the two slidable frames, one of the slots defined on one side of each side rail and one of the at least two threaded hole so as to couple the slidable frame with the slide rail;
    wherein, the two slidable frames (21) each is integrally formed and has a U-shaped cross section, and the two slide rails each also has a U-shaped cross section, so that the two slidable frames (21) each is engaged with one of the two slide rails tightly.

2. The TV panel mount according to claim 1, wherein, at least two security screws (4) each sequentially passes through one of the two slidable frames (21), one of the two slots (12), and one of the two slidable bars (14), and has an end portion threaded with a limiting member; wherein, each security screw cooperates with one of the at least two screws, when the one of the at least two screws is loosen, the corresponding security screw prevents the corresponding slidable frame from being detached from the corresponding slide rail.

3. The TV panel mount according to claim 2, wherein, a stop (121) is disposed at a middle location of each slot (12), and the stop (121) is integrally formed with the wall chassis (1), such that the slot (12) is divided into two shorter slots by the stop; the at least two screws are four screws, the at least two security screws are four security screws, each screw corresponds to one security screw to form a set of the screw and the security screw; one of the two slidable bars corresponds to one of the two slidable frames to form a set of the slidable bar and the slidable frame; two sets of the screw and the security screw are disposed on two ends of a set of slidable bar and the slidable frame respectively, and one of two sets of the screw and the security screw are located in one shorter slot, and the other of two sets of the screw and the security screw are located in the other short slot.

4. The TV panel mount according to claim 1, wherein, two sides of the mounting plate (22) and a middle of the mounting plate each is provided with a reinforcing rib (23) extended perpendicular to the extension direction of the two parallel slide rails (11).

5. The TV panel mount according to claim 1, wherein, a pair of parallel lug plates are fixed on a top portion of the mounting plate, and another pair of parallel lug plates are fixed on a bottom portion of the mounting plate, the two symmetrical primary supporting arms are fixed on the two pairs of parallel lug plates respectively.

6. The TV panel mount according to claim 5, wherein, an extension direction of the two pairs of parallel lug plates is parallel to the extension direction of the two parallel slide rails (11).

7. The TV panel mount according to claim 5, wherein, the TV panel holder comprises a connection assembly (601) coupled to the distal end of the secondary supporting arm (52), an egg-sectional tube (81) coupled to the connection assembly (601), and a vertical plate (7) hanged on the egg-sectional tube (81) and configured for mounting the TV panel.

8. The TV panel mount according to claim 7, wherein, the connection assembly further comprises a connection plate (6) hinged with the secondary supporting arm (52), a small rectangle plate (61) detachably assembled with the connection plate (6), and a large rectangle plate (64) detachably assembled with the small rectangle plate (61), wherein the egg-sectional tube (81) is mounted on the large rectangle plate (64).

9. The TV panel mount according to claim 8, wherein, the large rectangle plate (64) is mounted with a lever (62) configured to adjust an angle of the large rectangle plate (64) so that the large rectangle (64) rotates around an axial direction of the egg-sectional tube (81).

10. A TV panel mount comprising:
- a wall chassis (1) provided with two parallel slide rails (11), that is an upper slide rail (11) and a lower slide rail (11) parallel to the upper slide rail;
- a mounting base (2) comprising two parallel slidable frames (21) to be attached to the upper slide rail (11) and the lower slide rail (11) respectively, and a mounting plate (22) coupled between the two parallel slidable frames (21); wherein, each slidable frame (21) is integrally formed and has a U-shaped cross section, and each slide rail also has a U-shaped cross section, so that a U-shaped inner side of the slidable frame is attached with a U-shaped outside of the slide rail tightly, and the slidable frame (21) partially surrounds the slide rail in section;
- an adjustment member comprising at least two screws (3) each inserted through one surface of one slidable frame (21) parallel to the mounting plate (22);
- a mounting bracket comprising two symmetrical primary supporting arms, a secondary supporting arm (52) and a TV panel holder, one end of each primary supporting arm (5) is hinged on the mounting plate (22), and another end of each primary supporting arm (5) is hinged to the secondary supporting arm (52), and a distal end of the secondary supporting arm (52) is assembled with the TV panel holder, and the TV panel holder is for mounting a TV panel; and
- wherein, by rotating the at least two screws (3), tightness between the two parallel slidable frames (21) and the two parallel slide rails (11) are adjusted, so that the two parallel slidable frames (21) are slidable or are fixed along an extension direction of the two parallel slide rails (11).

11. The TV panel mount according to claim 10, wherein, outside corners (1100) of the two slide rails (11) are rounded to clear off inside edges (2100) of the slidable frames (21) for a reduced frictional force between the slide rails and the slidable frames.

12. The TV panel mount according to claim 11, wherein, a slot is defined on one surface of each slide rail which is parallel to the mounting plate and extending along the extension direction of the two parallel slide rails; a channel (13) is defined on an opposite surface of each slide rail along the extension direction of the two parallel slide rails and interconnected with the corresponding slot; two slidable bars (14) each is moveably accommodated in one of the two channels; at least one threaded hole is defined on each of the two slidable bars (14); each of the at least two screws (3) sequentially passes through one of the two slidable frames, one of two slots and one of the at least two threaded hole so as to couple the slidable frame with the slide rail; at least two security screws (4) each sequentially passes through one of the two slidable frames (21), one of the slots defined on one side of each side rail, and one of the two slidable bars (14), and has an end portion threaded with a limiting member; wherein, each security screw cooperates with one of the at least two screws, when the one of the at least two screws is loosen, the corresponding security screw prevents the corresponding slidable frame from being detached from the corresponding slide rail.

13. The TV panel mount according to claim 12, wherein, the TV panel holder comprises a connection assembly (601) coupled to the distal end of the secondary supporting arm (52), an egg-sectional tube (81) coupled to the connection assembly (601), and a vertical plate (7) hanged on the egg-sectional tube (81) and configured for mounting the TV panel.

14. The TV panel mount according to claim 13, wherein, the connection assembly further comprises a connection plate (6) hinged with the secondary supporting arm (52), a small rectangle plate (61) detachably assembled with the connection plate (6), and a large rectangle plate (64) detachably assembled with the small rectangle plate (61), wherein the egg-sectional tube (81) is mounted on the large rectangle plate (64).

15. The TV panel mount according to claim 14, wherein, the large rectangle plate (64) is mounted with a lever (62) configured to adjust an angle of the large rectangle plate (64) so that the large rectangle (64) rotates around an axial direction of the egg-sectional tube (81).

16. The TV panel mount according to claim 12, wherein, sidewalls of each slidable bar fit sidewalls of the corresponding channel respectively.

* * * * *